United States Patent
Wu

(10) Patent No.: US 8,406,069 B2
(45) Date of Patent: Mar. 26, 2013

(54) DATA WRITING METHOD AND WRITING DEVICE FOR AN ELECTRONIC ERASABLE READ ONLY DYNAMIC MEMORY

(75) Inventor: Pary Wu, New Taipei (TW)

(73) Assignee: Uni Grand Ltd., New Taipei (TW)

( * ) Notice: Subject to any disclaimer, the term of this patent is extended or adjusted under 35 U.S.C. 154(b) by 197 days.

(21) Appl. No.: 13/066,195

(22) Filed: Apr. 7, 2011

(65) Prior Publication Data

US 2012/0110245 A1    May 3, 2012

(51) Int. Cl.
G11C 7/00 (2006.01)
G11C 7/22 (2006.01)

(52) U.S. Cl. ................................. 365/189.16; 365/226

(58) Field of Classification Search ............. 365/189.16, 365/226
See application file for complete search history.

(56) References Cited

U.S. PATENT DOCUMENTS 8,117,378 B2 *   2/2012   Mietus et al. ................. 711/103
2011/0110173 A1 *   5/2011   Chang et al. ................. 365/191

* cited by examiner

Primary Examiner — Tuan T Nguyen
Assistant Examiner — Lance Reidlinger
(74) Attorney, Agent, or Firm — Quine Intellectual Property Law Group, P.C.

(57) ABSTRACT

A data writing method for an EEPROM in an electronic device is performed by a writing device. The electronic device includes a system unit generating a system voltage and a write-protection voltage. The writing device includes a processor stored with data to be written, and connected electrically to a connector with the same interface as that of an expansion connector of the electronic device. When the connector is connected electrically to the expansion connector, the processor generates a write-enable voltage greater than the system voltage upon receipt of the system voltage from the electronic device, and outputs the write-enable voltage to the system unit. The system unit raises the system voltage in response to the write-enable voltage such that the write-protection voltage is smaller than the raised system voltage to thereby enable the EEPROM to operate in a write state, where the processing unit writes the data into the EEPROM.

12 Claims, 4 Drawing Sheets

DATA WRITING METHOD AND WRITING DEVICE FOR AN ELECTRONIC ERASABLE READ ONLY DYNAMIC MEMORY

BACKGROUND OF THE INVENTION

1. Field of the Invention

The invention relates to a data writing method and writing device, and more particularly to a data writing method and writing device for an electronic erasable read only dynamic memory in an electronic device.

2. Description of the Related Art

FIG. 1 illustrates a game controller for a game apparatus (not shown). The game controller includes a main control device 9, and an expansion device 7. The main control device 9 includes a core unit 90, an electronic erasable read only dynamic memory (EEPROM) 91 stored with program data and connected electrically to the core unit 90, and an expansion connector 92 connected electrically to the core unit 90. The expansion device includes a subunit 70, and a connector 71 connected electrically to the subunit 70. The expansion connector 92 and the connector 71 have the same interface. The connector 71 is optionally connected to the expansion connector 92 if necessary.

The EEPROM 91 has a plurality of pins, such as WP, VDD, GND, SCL and SDA. The core unit 90 outputs a write-protection voltage to the WP pin, and outputs a system voltage to the VDD pin. The core unit 90 controls The EEPROM 91 using the write-protection voltage and the system voltage to operate in a write state or a read/write-protection state. That is, when the write-protection voltage is smaller than the system voltage, the EEPROM 91 is in the write state. Otherwise, the EEPROM is in the read/write-protection state. When the EEPROM 91 is in the write state, the core unit 90 is operable to rewrite updated data into the EEPROM 91.

The interface of each of the expansion connector 92 and the connector 71 includes VCC, GND, SCL and SDA terminals. As a result, if the program data in the EEPROM 91 needs to be upgraded or updated, the EEPROM 91 must be sent back to the original fabrication company to record new firmware data. Alternatively, updating firmware is carried out by execution of a software program installed in a computer device and provided by the original fabrication company. Therefore, data writing for the EEPROM 91 is inconvenient.

SUMMARY OF THE INVENTION

Therefore, an object of the present invention is to provide a data writing method and writing device that can overcome the aforesaid drawbacks of the prior art.

According to one aspect of the present invention, there is provided a data writing method for an EEPROM in an electronic device using a writing device. The electronic device includes an expansion connector connected electrically to the EEPROM, and a system unit connected electrically to the EEPROM and the expansion connector, and generating a system voltage and a write-protection voltage. The EEPROM receives the system voltage and the write-protection voltage from the system unit such that the EEPROM is operable, based on the system voltage and the write-protection voltage, in a write-protection state when the write-protection voltage is not smaller than the system voltage, or in a write state when the write-protection voltage is smaller than the system voltage. The writing device has stored data to be written into the EEPROM, and includes a connector having the same interface as that of the expansion connector. The data writing method comprises the steps of:

a) when the connector of the writing device is connected to the expansion connector of the electronic device such that the writing device receives the system voltage from the system unit of the electronic device via the expansion connector, generating a write-enable voltage greater than the system voltage, and outputting the write-enable voltage to the system unit of the electronic device via the expansion connector;

b) raising the system voltage in response to the write-enable voltage received by the system unit such that the write-protection voltage is smaller than the raised system voltage to thereby enable the EEPROM to operate in the write state; and c) writing the data from the writing device into the EEPROM via the expansion connector.

According to another aspect of the present invention, there is provided a writing device for an EEPROM in an electronic device. The electronic device includes an expansion connector connected electrically to the EEPROM, and a system unit connected electrically to the EEPROM and the expansion connector, and generates a system voltage and a write-protection voltage. The EEPROM receives the system voltage and the write-protection voltage from the system unit such that the EEPROM is operable, based on the system voltage and the write-protection voltage, in a write-protection state when the write-protection voltage is not smaller than the system voltage, or in a write state when the write-protection voltage is smaller than the system voltage. The writing device comprises:

a connector having the same interface as that of the expansion connector, the connector being adapted to connected detachably to the expansion connector of the electronic device; and a processing unit connected electrically to the connector and stored with data to be written into the EEPROM.

When the connector is connected to the expansion connector, the processing unit receives the system voltage from the system unit of the electronic device via the expansion connector and the connector, and is operable to output a write-enable voltage greater than the system voltage to the system unit via the connector and the expansion connector.

The system unit is capable of raising the system voltage in response to the write-enable voltage from the processing unit such that the write-protection voltage is smaller than the raised system voltage to thereby enable the EEPROM to operate in the write state.

The processing unit is operable to write the data into the EEPROM via the connector and the expansion connector when the EEPROM is in the write state.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
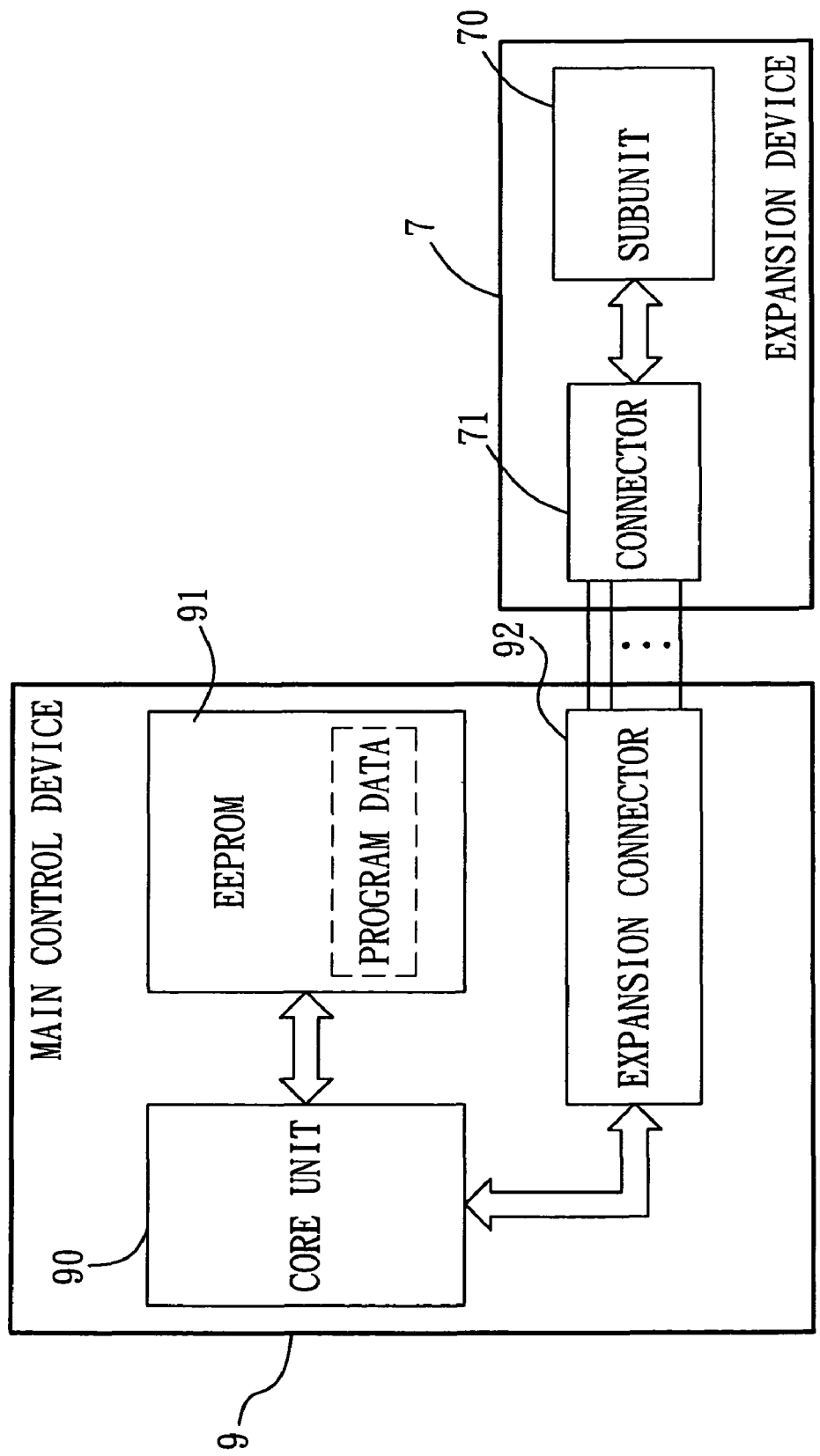
FIG. 1 is a schematic circuit block diagram of a game controller.
Figure 2:
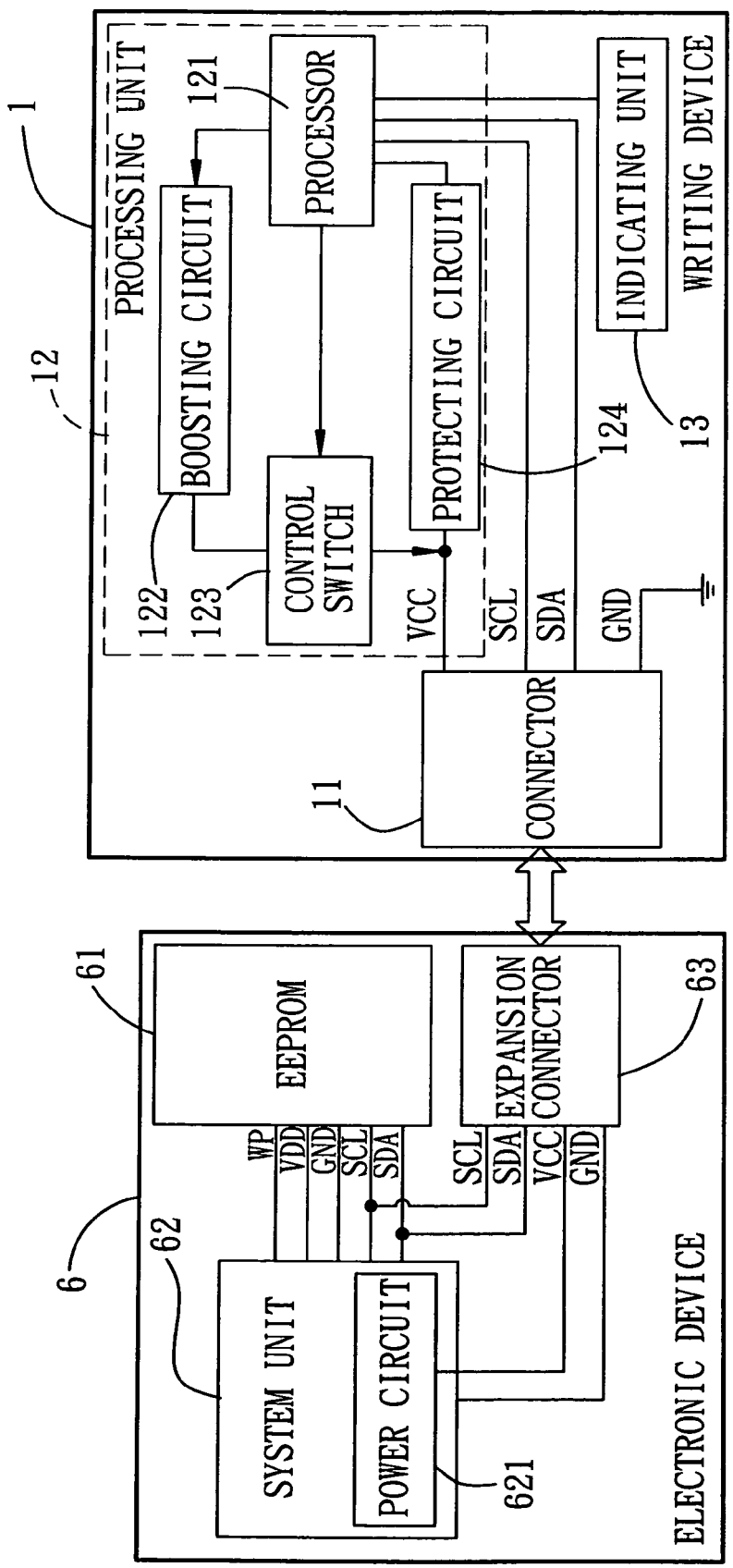
FIG. 2 is a schematic circuit block diagram illustrating the preferred embodiment of a writing device for an EEPROM in an electronic device according to the present invention.
Figure 3:
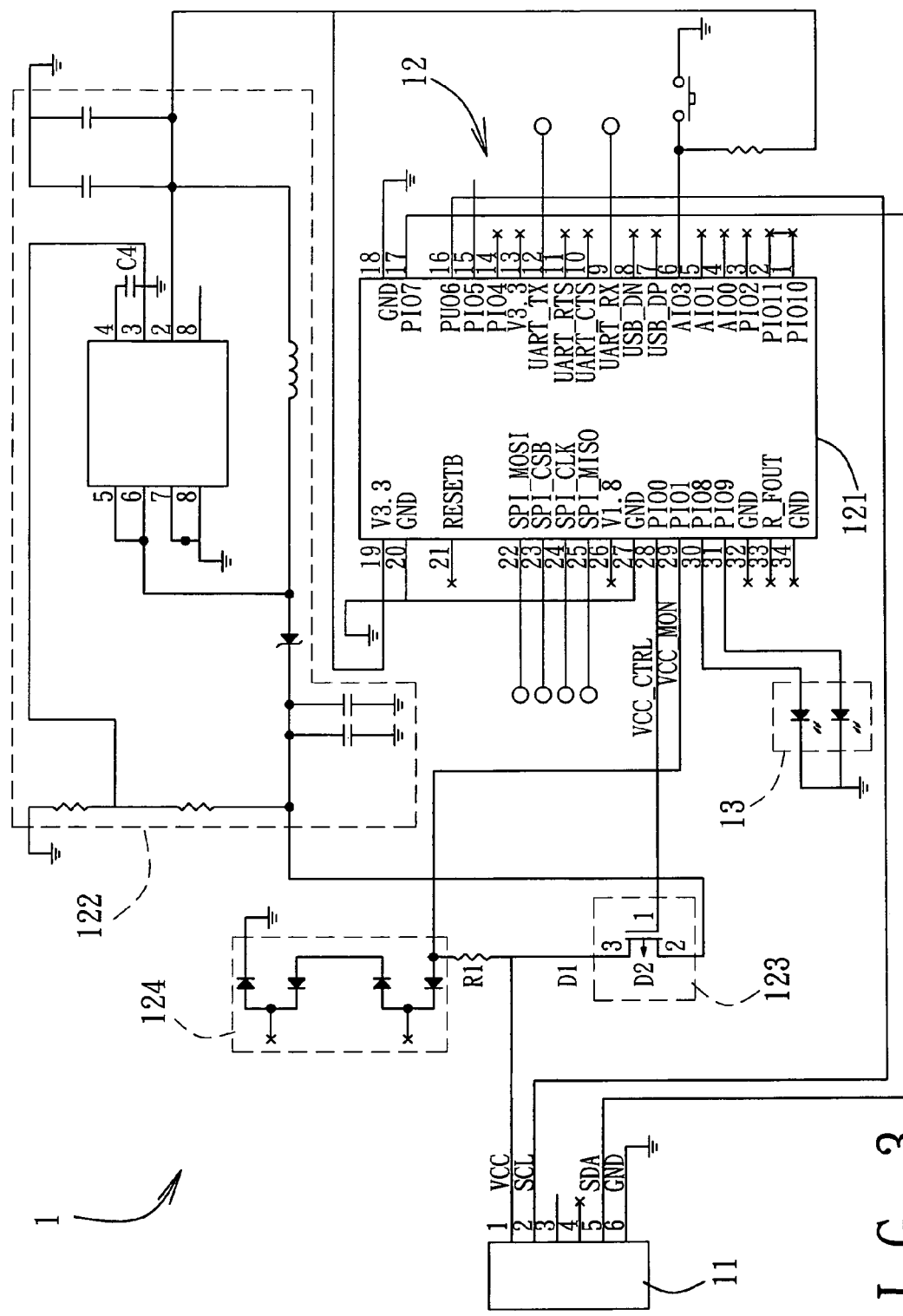
FIG. 3 is a schematic electrical circuit diagram illustrating the preferred embodiment.

Referring to FIGS. 2 and 3, the preferred embodiment of a writing device 1 for an EEPROM 61 in an electronic device 6 according to the present invention is shown.

The electronic device 6 can be a game controller for a game apparatus, such as a Wii sports apparatus. The electronic device 6 includes an expansion connector 63 connected electrically to the EEPROM 61, and a system unit 62 connected electrically to the EEPROM 61 and the expansion connector 63. The EEPROM 61 has WP, VDD, GND, SCL and SDA pins coupled to the system unit 62. The expansion connector 63 has an interface constituting SCL, SDA VCC and GND terminals, wherein the VCC and GND terminals are coupled to the system unit 63, and the SCL and SDA terminals are coupled respectively to the SCL and SDA pins of the EEPROM 61. After initialization of the electronic device 6, the system unit 62 generates a system voltage and a write-protection voltage. Normally, the system voltage has an initial voltage value, for example, 3.3V. The system unit 62 outputs the write-protection voltage and the system voltage to the WP and VDD pins of the EEPROM 61 such that the EEPROM 61 is operable, based on the write-protection voltage and the system voltage, in a write-protection state when the write-protection voltage is not smaller than the system voltage, or in a write state when the write-protection voltage is smaller than the system voltage.

The writing device 1 includes a connector 11, a processing unit 12 connected electrically to the connector 11, and an indicating unit 13 connected electrically to the processing unit 12.

The connector 11 has the same interface as that of the expansion connector 63 of the electronic device 6. That is, the connector 11 includes a power supplying terminal (VCC) for power transmission, two data transmission terminals (SCL, SDA) for data transmission, and a ground terminal (GND). The connector 11 is adapted to be connected detachably to the expansion connector 63 of the electronic device 6.

The processing unit 12 has stored data to be written into the EEPROM 61. When the connector 11 is connected to the expansion connector 63 of the electronic device 6, the processing unit 12 receives the system voltage from the system unit 62 of the electronic device 6 via the expansion connector 63 and the connector 11, and is operable to output a write-enable voltage greater than the system voltage to the system unit 62 via the connector 11 and the expansion connector 63. In this embodiment, the processing unit 12 includes a processor 121, a boosting circuit 122, a control switch 123, and a protecting circuit 124.

The processor 121 has stored the data, and is coupled to the connector 11. The processor 121 is capable of detecting, based on a detecting voltage (VCC_MON) received at a pin 29 of the processor 121, that the system voltage from the system unit 62 has been transmitted to the power supplying terminal (VCC), thereby confirming connection between the connector 11 and the expansion connector 63 of the electronic device 6. The processor 121 is operable to output a voltage of 3.3V at a pin 19 of the processor 121 upon receipt of the system voltage from the power supplying terminal (VCC) of the connector 11.

The boosting circuit 122 is connected electrically to the processor 121 for receiving the voltage from the pin 19 of the processor 121. The boosting circuit 122 boosts the voltage to generate the write-enable voltage. For example, the write-enable voltage is equal to about 11V.

The control switch is coupled between the power supplying terminal (VCC) of the connector 11 and the boosting circuit 122. The control switch 123 is a transistor, and has a control end coupled to a pin 28 of the processor 121. The processor 121 outputs a control voltage (VCC_CTRL) at the pin 28 to control the control switch 123 to establish electrical connection between the boosting circuit 122 and the power supplying terminal (VCC) upon receipt of the system voltage from the power supplying terminal (VCC) of the connector 11, thereby transmitting the write-enable voltage from the boosting circuit 122 to the power supplying terminal (VCC) via the control switch 123.

The protecting circuit 124 is connected electrically between the power supplying terminal (VCC) of the connector 11 and the processor 121 for protecting the processing unit 12 when the system voltage from the electronic device 6 is greater than a certain voltage. In this embodiment, the certain voltage has a voltage value equal to two times the initial voltage value of the system voltage. For example, the certain voltage is a voltage of 6.6V. In addition, the protecting circuit 124 includes four diodes connected in series. As a result, the detecting voltage (VCC_MON) remains at 2.8V even if the system voltage from the electronic device 6 is greater than 6.6V.

When the write-enable voltage from the writing device 1 is received by a power circuit 621 of the system unit 62, the system unit 62 is capable of raising the system voltage in response to the write-enable voltage such that the write-protection voltage is smaller than the raised system voltage to thereby enable the EEPROM to operate in the write state. In this embodiment, the raised system voltage is less than the write-enable voltage, and has a voltage value equal to two times the initial voltage value of the system voltage. Preferably, the voltage value of the raised system voltage ranges from 2.5 times the initial voltage value of the system voltage to 3 times the same. For example, the raised system voltage is up to 9.5V. At the same time, the raised system voltage is also transmitted to the processing unit 12 via the expansion connector 63 and the connector 11. Due to the presence of the protecting circuit 123, the raised system voltage of 9.5V will not damage the processing unit 12.

When the EEPROM 61 is in the write state, the processor 121 is operable to write the data into the EEPROM 61 via the data transmission terminals (SCL, SDA) of the connector 11 and the SCL and SDA terminals of the expansion connector 63.

The indicating unit 13 is connected electrically to the processor 121 of the processing unit 12. The indicating unit 13 is controlled by the processor 121 to indicate a current operating state of the EEPROM 11. In this embodiment, the indicating unit 13 includes a plurality of light emitting diodes.

Thereafter, when the connector 11 is detached from the expansion connector 63, the system voltage is reduced to the initial voltage value. As a result, the write-protection voltage is not smaller than the system voltage such that the EEPROM 61 is switched from the write state to the write-protection state.

Figure 4:
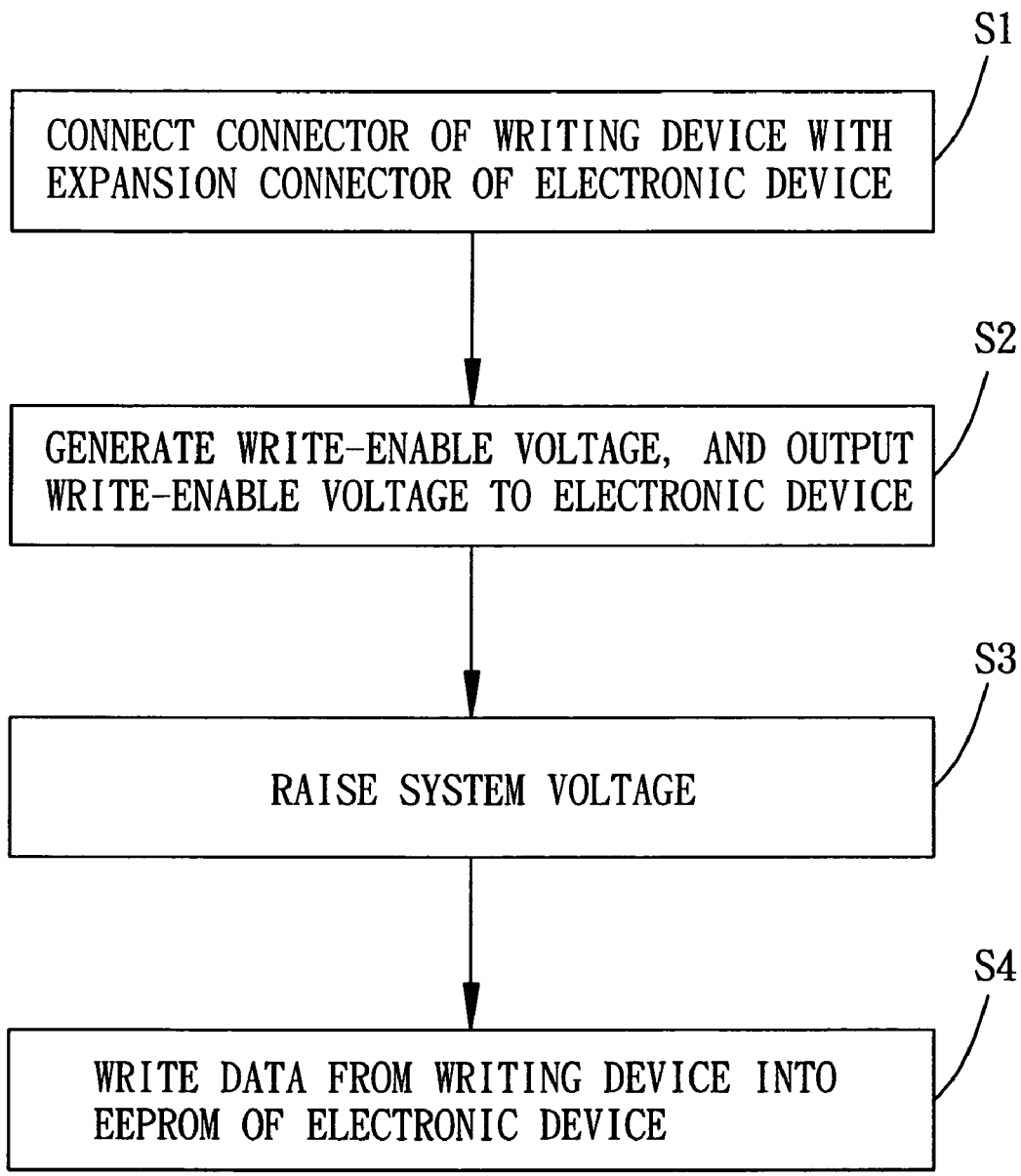
FIG. 4 is a flow chart of a data writing method for the EEPROM performed using the preferred embodiment and the electronic device.

FIG. 4 illustrates a flow chart of a data writing method for the EEPROM 61 performed using the writing device 1 and the electronic device 6.

In step S1, the connector 11 of the writing device 1 is connected to the expansion connector 63 of the electronic device 6 such that the processing unit 12 of the writing device 1 receives the system voltage from the system unit 62 of the electronic device 6 via the connector 11.

In step S2, the processing unit 12 generates the write-enable voltage, and outputs the write-enable voltage to the system unit 62 of the electronic device 6 via the connector 11 and the expansion connector 63 of the electronic device 6.

In step S3, the system unit 62 raises the system voltage in response to the write-enable voltage from the writing device 1 such that the EEPROM 61 is switched from the write-protection state to the write state.

In step S4, the processing unit 12 of the writing device 6 writes the data into the EEPROM 11 via the connector 11 and the expansion connector 63.

In sum, data can be easily written into the EEPROM 11 by the writing device 1 of the present invention compared to the prior art.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A data writing method for an electronic erasable read only dynamic memory (EEPROM) in an electronic device using a writing device, the electronic device including an expansion connector connected electrically to the EEPROM, and a system unit connected electrically to the EEPROM and the expansion connector, and generating a system voltage and a write-protection voltage, the system voltage having an initial voltage value, the EEPROM receiving the system voltage and the write-protection voltage from the system unit such that the EEPROM is operable, based on the system voltage and the write-protection voltage, in a write-protection state when the write-protection voltage is not smaller than the system voltage, or in a write state when the write-protection voltage is smaller than the system voltage, the writing device having stored data to be written into the EEPROM and including a connector having the same interface as that of the expansion connector said data writing method comprising the steps of:

a) when the connector of the writing device is connected to the expansion connector of the electronic device such that the writing device receives the system voltage from the system unit of the electronic device via the expansion connector, generating a write-enable voltage greater than the system voltage, and outputting the write-enable voltage to the system unit of the electronic device via the expansion connector;

b) raising the system voltage in response to the write-enable voltage received by the system unit such that the write-protection voltage is smaller than the raised system voltage to thereby enable the EEPROM to operate in the write state; and c) writing the data from the writing device into the EEPROM via the expansion connector.

2. The data writing method as claimed in claim 1, wherein the write-enable voltage is greater than the raised system voltage.

3. The data writing method as claimed in claim 2, wherein the system voltage raised in step b) has a voltage value that is not less than two times the initial voltage value.

4. A writing device for an electronic erasable read only dynamic memory (EEPROM) in an electronic device, the electronic device including an expansion connector connected electrically to the EEPROM, and a system unit connected electrically to the EEPROM and the expansion connector, and generating a system voltage and a write-protection voltage, the system voltage having an initial voltage value, the EEPROM receiving the system voltage and the write-protection voltage from the system unit such that the EEPROM is operable, based on the system voltage and the write-protection voltage, in a write-protection state when the write-protection voltage is not smaller than the system voltage, or in a write state when the write-protection voltage is smaller than the system voltage, said writing device comprising:

a connector having the same interface as that of the expansion connector, said connector being adapted to be connected detachably to the expansion connector of the electronic device; and a processing unit connected electrically to said connector and stored with data to be written into the EEPROM;

wherein, when said connector is connected to the expansion connector, said processing unit receives the system voltage from the system unit of the electronic device via the expansion connector and said connector, and is operable to output a write-enable voltage greater than the system voltage to the system unit via said connector and the expansion connector;

wherein the system unit is capable of raising the system voltage in response to the write-enable voltage from said processing unit such that the write-protection voltage is smaller than the raised system voltage to thereby enable the EEPROM to operate in the write state; and wherein said processing unit is operable to write the data into the EEPROM via said connector and the expansion connector when the EEPROM is in the write state.

5. The writing device as claimed in claim 4, wherein said connector includes a power supplying terminal for power transmission, and a data transmitting terminal set for data transmission.

6. The writing device as claimed in claim 5, wherein said processing unit includes a processor stored with the data and coupled to said connector, said processor being capable of detecting that the system voltage from the system unit of the electronic device is transmitted to said power supplying terminal of said connector, thereby confirming connection between said connector and the expansion connector of the electronic device, said processor being operable to output a voltage upon receipt of the system voltage from said power supplying terminal of said connector, a boosting circuit connected electrically to said processor for receiving the voltage therefrom, said boosting circuit boosting the voltage to generate the write-enable voltage, and a control switch coupled between said power supplying terminal of said connector and said boosting circuit, said control switch having a control end coupled to said processor such that said processor controls said control switch to establish electrical connection between said boosting circuit and said power supplying terminal of said connector upon receipt of the system voltage from said power supplying terminal of said connector, thereby transmitting the write-enable voltage from said boosting circuit to said power supplying terminal of said connector via said control switch; and wherein, when the EEPROM is in the write state, said processor is operable to write the data into the EEPROM via said data transmitting terminal set of said connector and the expansion connector.

7. The writing device as claimed in claim 6, wherein said processing unit further includes a protecting circuit connected electrically between said power supplying terminal of said connector and said processor for protecting said processing unit when the system voltage from the electronic device is greater than a certain voltage.

8. The writing device as claimed in claim 7, wherein the certain voltage has a voltage value equal to two times the initial voltage value of the system voltage.

9. The writing device as claimed in claim 7, wherein said protecting circuit includes a plurality of diodes connected in series.

10. The writing device as claimed in claim 4, further comprising an indicating unit connected electrically to said processing unit and controlled by said processing unit to indicate a current operating state of the EEPROM.

11. The writing device as claimed in claim 10, wherein said indicating unit includes a plurality of light emitting diodes.

12. The writing device as claimed in claim 4, wherein:
  the raised system voltage has a voltage value that is not less than two times the initial voltage value; and
  the write-enable voltage is greater than the raised system voltage.

* * * * *